United States Patent [19]

Ota et al.

[11] Patent Number: 5,733,381

[45] Date of Patent: Mar. 31, 1998

[54] THIN-FILM SOLAR CELL ARRAY AND METHOD OF MANUFACTURING SAME

[75] Inventors: Hiromitsu Ota; Sugao Saito, both of Yokosuka, Japan

[73] Assignee: Fuji Electric Co., Ltd., Japan

[21] Appl. No.: 661,706

[22] Filed: Jun. 11, 1996

Related U.S. Application Data

[63] Continuation of Ser. No. 420,838, Apr. 11, 1995, abandoned, which is a continuation-in-part of Ser. No. 171,480, Dec. 22, 1993, Pat. No. 5,421,908.

[30] Foreign Application Priority Data

May 25, 1994 [JP] Japan ...................... 6-110632

[51] Int. Cl.⁶ ........................................ H01L 31/18
[52] U.S. Cl. .................. 136/244; 437/2; 437/51; 437/205
[58] Field of Search ............... 136/244; 437/2–5, 437/51, 205

[56] References Cited

U.S. PATENT DOCUMENTS

| | | | |
|---|---|---|---|
| 4,609,770 | 9/1986 | Nishiura et al. | 136/244 |
| 4,754,544 | 7/1988 | Hanak | 437/2 |
| 5,296,043 | 3/1994 | Kawakami et al. | 136/244 |
| 5,421,908 | 6/1995 | Yoshida et al. | 136/244 |

FOREIGN PATENT DOCUMENTS 63-10590  3/1988  Japan ...................... 136/256

*Primary Examiner*—Aaron Weisstuch
*Attorney, Agent, or Firm*—Rossi & Associates

[57] ABSTRACT

A transparent second electrode layer laminated over a laminated composite of a solar cell structure is connected to a third electrode layer disposed opposite the substrate via through holes spaced longitudinally and equidistantly apart from each other. The laminated composite and the third electrode layer are respectively segmented by separating grooves into regions involving through holes of a number inversely proportional to that of the series-connected solar cell units. A first electrode layer is connected to the third electrode layer via the through holes of the substrate or via conductors passing over the side thereof in the adjoining region across the separating grooves. The through holes for connected in the first electrode layer with the third electrode layer and the through holes for connecting the second electrode layer with the third electrode layer are formed and arranged equidistantly apart from each other, and the latter through holes which are not needed are removed.

10 Claims, 11 Drawing Sheets

THIN-FILM SOLAR CELL ARRAY AND METHOD OF MANUFACTURING SAME

This is a continuation of application Ser. No. 08/420,830 filed Apr. 11, 1995, now abandoned, which was a Continuation-In-Part of application Ser. No. 08/171,480 filed Dec. 22, 1993, now U.S. Pat. No. 5,421,908.

BACKGROUND OF THE INVENTION

1. Field of Industrial Utilization

The present invention relates to a thin-film solar cell array, which has an amorphous silicon thin-film and the like as a photoelectric conversion layer, disposed, for example, on a flexible strip substrate and a method for the manufacture thereof.

2. Prior Art

A thin-film solar-cell element comprising a rear electrode layer, a photoelectric conversion layer, a transparent electrode layer sequentially laminated on a substrate, wherein among a plurality of such thin-film photoelectric conversion elements, which admit light from the transparent electrode layer and convert it to electricity, the rear electrode layer, the photoelectric conversion layer, and the transparent layer are sequentially formed, but before disposing next layer they are separated by various patterning processes to form a series connected structure, is disclosed, for example, in Japanese Patent Publication No. Hei 5-72113. One of the purposes of this series connection structure is, on the one hand, to obtain a high output voltage from one solar cell array, and on the other hand, to reduce the ohmic losses in the transparent electrode. By way of explanation, if the solar cell is formed as one unit over the entire surface of the substrate without forming the series connection structure, photo-generated carriers migrate over a long distance in the transparent electrode and the rear electrode to the lead output leads disposed at the ends of the solar cell.

The metallic electrode generally has a low resistance. As a result, resistive losses caused by the current flowing through the metallic electrode may be neglected. However, the sheet resistance of the transparent conductive thin-film may normally be as large as 5 to 30 ohms per square, hence resistive losses caused by the current flowing over a long distance in the transparent electrode layer cannot be disregarded. For this reason, conventional technology usually divides a large-area solar cell into a plurality of strip-formed cells, each with a width from 4 mm to 20 mm.

If a solar cell is partitioned into strip-formed cells connected in series, dead spaces that do not contribute to power generation are created at the connections, reducing the effective area for power generation and therefore, the output from the solar cell. Thin-film solar cells, which are described in the specifications of the Japanese Patent Applications No. Hei 4-347394; No. Hei 5-78382; No. Hei 5-67976, and No. Hei 5-220870, in the names of the applicants, provide an auxiliary electrode layer disposed on the rear face of a flexible substrate of a plastic film or the like, in which the auxiliary electrode layer is connected through a connection hole to a rear electrode layer or a transparent electrode layer. Such series connection of solar cell units via the auxiliary electrode layer prevents reduction of the effective area for power generation.

OBJECTS OF THE INVENTION

The thin-film solar cell made of film type substrates features low material cost and mass producibility, that is, low cost. The amorphous-silicon solar cell also features ease of formation of the integrated structure and therefore, design capability which ensures an arbitrary output voltage for a given area thereof. The output voltage of the solar cell is varied depending upon the system design of an inverter or battery to be connected thereto. In mass production, however, varying the design voltage of the solar cell as required may lower the productivity thereof. To mass-produce the solar cells of various output voltages, it is necessary to vary at will the voltage thereof in the later manufacturing processes of production.

The present invention is intended to solve the conventional problems discussed above, and provide a thin-film solar cell adaptable for providing the desired output voltage and applicable to mass production, and a method for the manufacture of such a solar cell.

SUMMARY OF THE INVENTION

In order to achieve the above objectives, the thin film solar cell according to the present invention has a structure in which a first electrode layer is disposed on a face of an insulating strip substrate; a semiconductor layer, which is a photoelectric conversion layer, is formed on the first electrode layer, and a transparent second electrode layer is sequentially laminated thereover; the above layers form a laminated composite; a third electrode layer is disposed on the opposite face of the substrate; a plurality of through holes is equidistantly spaced in the longitudinal direction of the substrate; the second electrode layer is electrically connected to the third electrode layer by a conductor which extends into the through hole for connection and is substantially insulated from the first electrode layer; the first electrode layer is electrically connected to the third electrode layer by another conductor which extends into the through hole for connection and is positioned at intervals for which the distance between the through holes is multiplied by an integer; the laminated composite is segmented on the face of the substrate by first separating grooves which are positioned transversely to the substrate between the above located conductor and the adjoining through hole; and the third electrode layer is also segmented on the opposed face of the substrate by second separating grooves which are positioned transversely to the substrate across the above located conductor and opposite the first separating grooves. In a preferred structure of the present invention; the first through holes, via which the second electrode layer is connected to the third electrode layer, and the second through holes, via which the conductor connects the first electrode layer with the third electrode layer, are so arranged that the interval of the first through holes multiplied by an integer equals that of the second through holes in the longitudinal direction of the substrate; or the above conductors pass not through the second through hole but over a side face of the substrate; the first through holes, via which the second electrode layer is connected to the third electrode layer, passes through the laminated composite, the substrate and the third electrode layer; and the second through holes pass at least through a region of the first electrode layer over which the second electrode layer is not formed, the substrate and the third electrode layer.

In a method of the present invention for manufacturing the thin-film solar cell as described above, the manufacturing processes involved are sequentially forming on a face of the insulating strip substrate the first electrode layer, the semiconductor layer for photoelectric conversion, and the transparent second layer; forming the third electrode layer on the opposite side of the substrate; forming and arranging the first through holes at equal intervals in the longitudinal direction of the substrate; providing conductors therethrough which are substantially insulated from the first electrode layer and connect the second electrode layer with the third electrode layer; forming and arranging the second through holes at intervals equal to those of the first through holes but not intersected thereby in the transverse direction of the substrate; providing conductors therethrough which are substantially insulated from the second electrode layer and connect the first electrode layer with the third electrode layer; selecting the third through holes out of the second through holes aligned in the longitudinal direction of the substrate in terms of a number thereof divided by an integer, arranging the second through holes at equal intervals and removing the conductor from the third through holes; forming transversely to the substrate the first separating grooves, which separates at least the laminated composite and are positioned between the second through holes and the adjoining first through holes; and forming transversely to the substrate the second separating grooves, which separate the third electrode layer and are positioned opposite the first separating grooves across the second through holes.

In order to remove the inner side of the third through holes, it is a preferred fabrication mode to form larger through holes including the third through holes through the first electrode layer, the substrate, and the third electrode layer or to remove the peripheral portion of the third through holes involving the substrate, the first electrode layer, and the third electrode layer.

In another manufacturing method of the present invention, the manufacturing processes involved are; forming the first electrode layer on a face of the insulating strip substrate, sequentially laminating the semiconductor layer for photoelectric conversion and the transparent second layer thereover, thereby forming the laminated composite; forming the third electrode layer on the opposite side of the substrate; forming and arranging the first through holes at equal intervals in the longitudinal direction of the substrate and then providing conductors therethrough which are substantially insulated from the first electrode layer and connect the second electrode layer with the third electrode layer; forming transversely to the substrate the first separating grooves equidistantly spaced, which separate at least the laminated composite, and partition a plurality of the first through holes aligned in the longitudinal direction of the substrate; providing a conductor, which connects the second electrode layer with the third electrode layer, at a position across the first separating groove adjoining the first through holes; forming transversely to the substrate the second separating grooves, which separate the third electrode layer and are positioned opposite the first separating groove across from the above positioned conductor. It is another preferred fabrication mode to form through holes which pass through the first electrode layer, the substrate, and the third electrode layer, and then to fill a conductive material therein to connect the first electrode layer with the third electrode layer.

By forming and arranging in the longitudinal direction of the substrate the through holes for connecting the second electrode layer with the third electrode layer and the through holes for connecting the first electrode layer with the third electrode layer at equal intervals but shifted with respect to each other, and making use of these in a number divided by an integer among the through holes for connecting the first electrode layer with the third electrode layer, it is possible to achieve with ease a solar cell structure which connects a solar cell unit, which has the above integral number of the through holes for connecting the second electrode layer with the third electrode layer, in series, after fabricating the electrode layers and the through holes described above. Besides using the through holes for connecting the first electrode layer with the third electrode layer, these through holes may be filled with a conductive material; or besides filling the second through holes with the conductive material, it is also possible to provide the connecting conductor passing over a side of the substrate. Various solar cells can be formed by the processes described above, by producing the material thereof in a single process and, not adversely affecting productivity, by varying the output voltage thereof as required by the use. Such processes needed to vary the output voltage by removing the peripheral portion of the through holes for segregating layers and connecting the first electrode layer with the third electrode layer or to provide the connecting conductor passing over the side of the substrate are simple and consume less time in the overall production process.

BRIEF DESCRIPTION OF THE DRAWINGS

The embodiments of the present invention are explained hereinafter with reference to the appended drawings, wherein:

In FIGS. 3(a) to (e) is a plan view, and (b) (c) (d) and (e) are cross-sectional views taken along lines B—B, C—C, D—D and E—E of (a) respectively;

In FIGS. 4(a) to (e), (a) is a plan view, and (b) (c) (d), and (e) are cross-sectional views taken along lines B—B, C—C, D—D, and E—E of (a) respectively;

In FIGS. 5(a) to (e), (a) is a plan view, and (b), (c), (d), and (e) are cross-sectional views taken along lines B—B, C—C, D—D, and E—E of (a) respectively;

In FIGS. 11(a) to (d), (a) is a plan view, and (b), (c), and (d) are cross-sectional views taken along lines B—B, C—C, and D—D of (a) respectively;

In FIGS. 12(a) to (e) (a) is a plan view, and (b) (c) (d), and (e) are cross-sectional views taken along lines B—B, C—C, D—D, and E—E of (a) respectively; In FIGS. 13(a) to (e), (a) is a plan view, and (b), (c), (d), and (e) are cross-sectional views taken along lines B—B, C—C, D—D, and E—E of (a) respectively.

DETAILED DESCRIPTION OF THE PREFERRED EMBODIMENTS

Figure 1A:
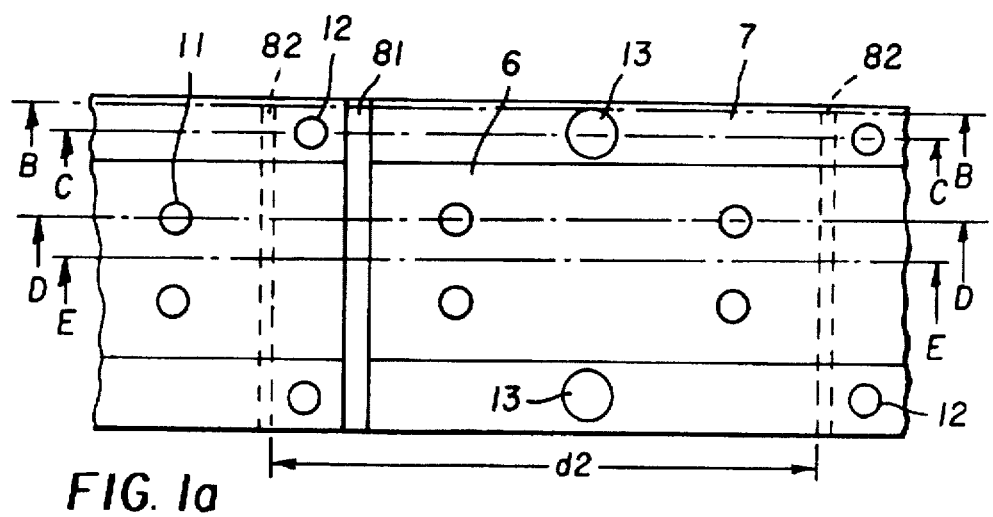
FIGS. 1(a) to (e) are fragmentary drawings showing a thin-film solar cell array, according to one embodiment of the present invention, where (a) is a plan view and (b), (c), (d), and (e) are cross-sectional views taken along lines B—B, C—C, D—D, and E—E of (a) respectively.
Figure 1B:
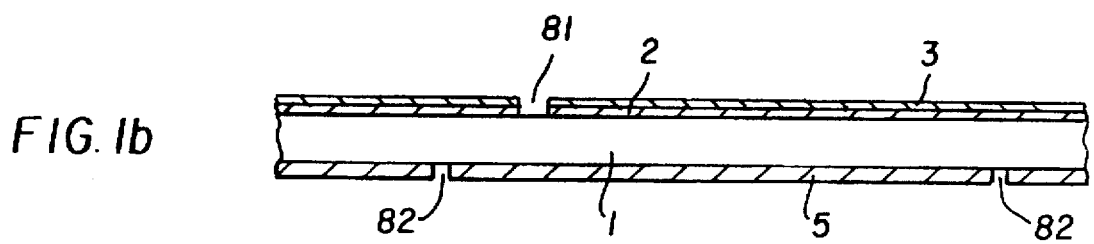
Figure 1C:
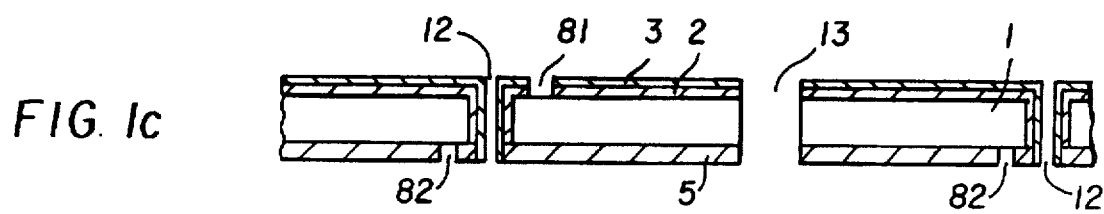
Figure 1D:
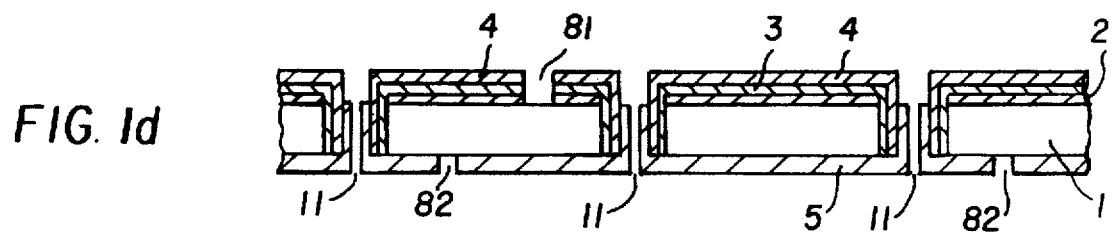
Figure 1E:
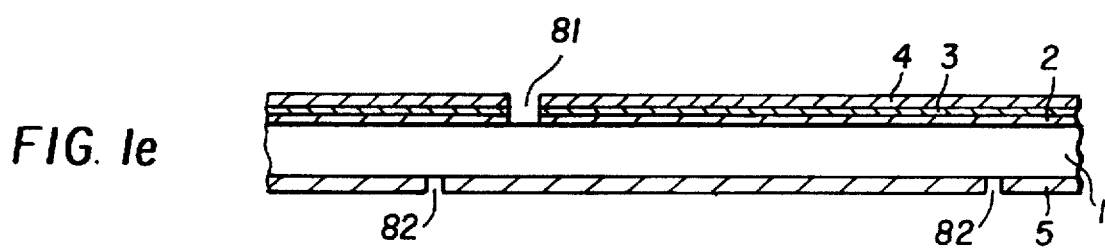
Figure 2A:
FIGS. 2(a) to (g) are cross-sectional drawings showing the manufacturing processes of a solar cell stock material, according to one embodiment of the present invention, in order from (a) to (g)
Figure 2B:
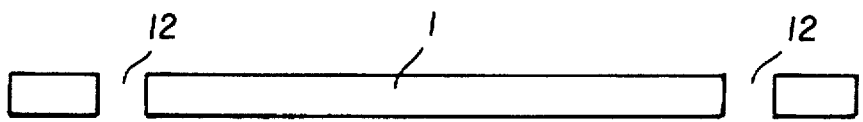
Figure 2C:
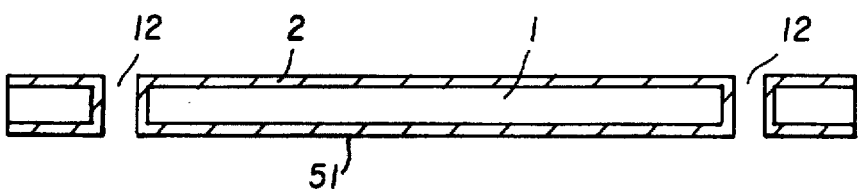
Figure 2D:
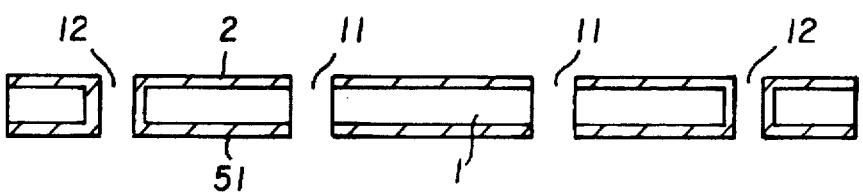
Figure 2E:
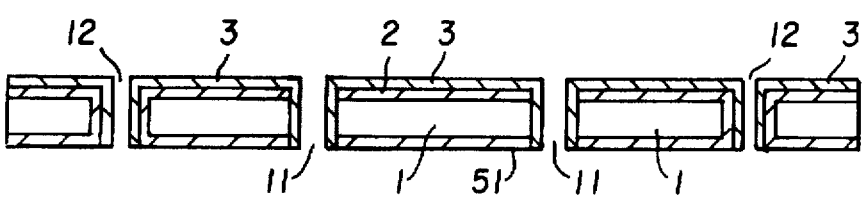
Figure 2F:
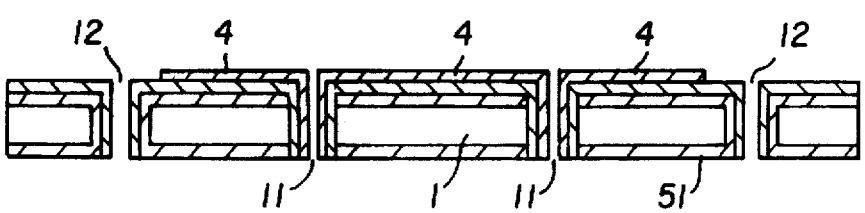
Figure 2G:
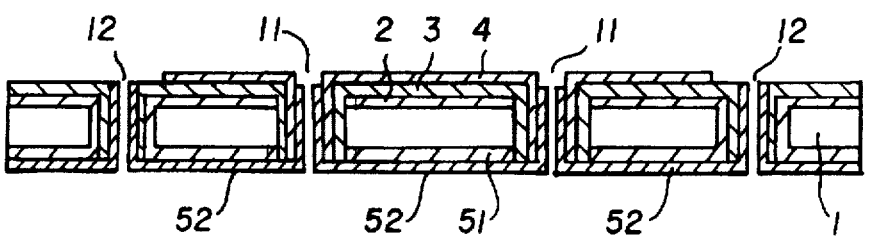
Figure 3A:
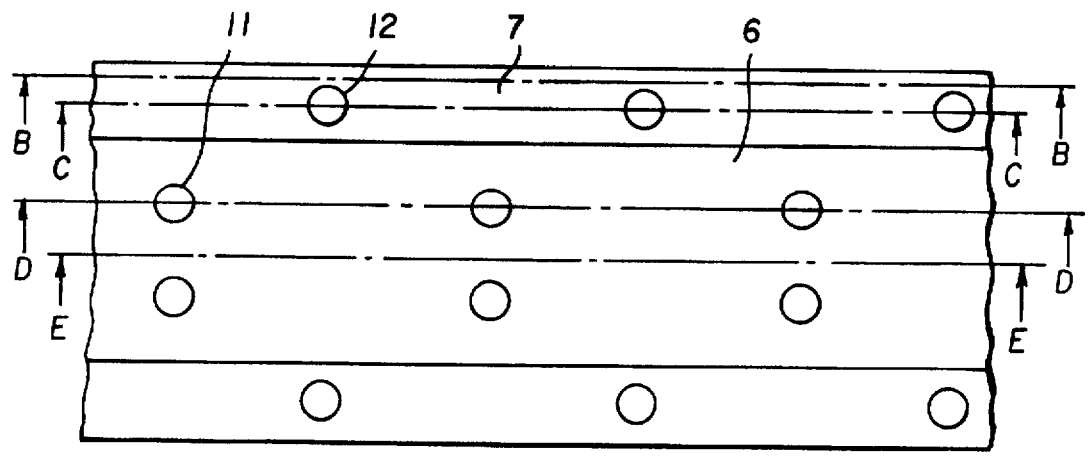
FIGS. 3(a) to (e) are fragmentary drawings showing the solar cell stock material, which is manufactured by the processes of FIG. 2.
Figure 3B:
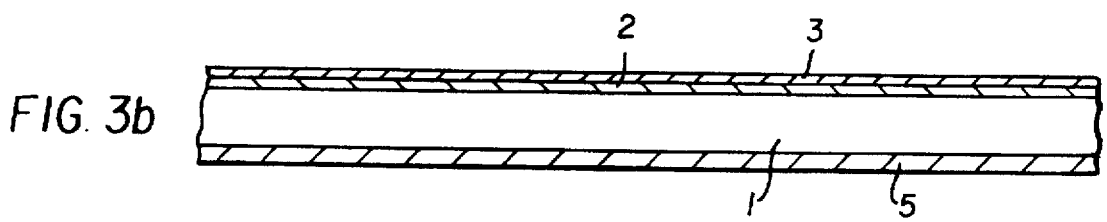
Figure 3C:
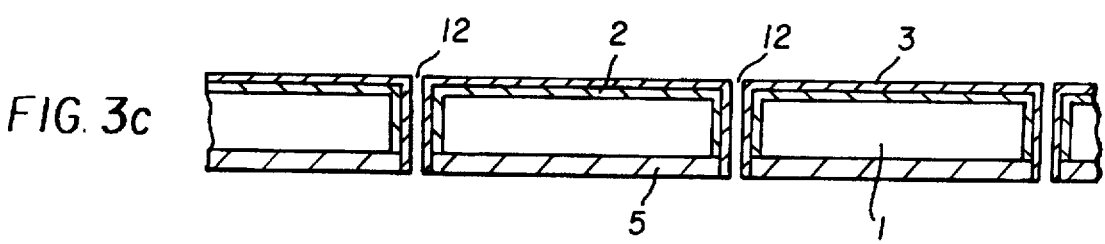

FIGS. 2(a) to (g) are cross-sectional drawings showing the manufacturing processes of a thin-film solar cell material, according to one embodiment of the present invention. An aramid film with a thickness of 60 microns was used for the substrate 1 of FIG. 2(a); however, the substrate may be formed of an insulating plastic film of PES, PET, PEN, polyamide, or the like. As shown in FIG. 2(b) a plurality of the second through holes 12 are formed at equally spaced intervals. In this embodiment, the plurality of second through holes 12 were mechanically punched through the substrate. An energy beam such as a laser may also be used. The shape of the through hole is not be restricted to a circle but may preferably define, for example, an ellipse or a rectangle to better effect, which of the smaller area and the longer circumference thereof will produce. As shown in FIG. 2(c) a first electrode layer 2 and a third electrode layer 51 made of Ag with a thickness of several hundreds nm are formed using a sputtering process. Besides this electrode material, a multi-layer film comprising an Al or Ag transparent electrode layer may also be used. Either the first electrode layer 2 or the third electrode layer 51 may be deposited first. The first electrode layer 2 and the third electrode layer 51 extend into the second through holes 12 and therefore, are connected to each other with a resistance as low as practically allowable. These layers may be fabricated not only by a sputtering process but also by other conventional deposition processes. As shown in FIG. 2(d) a plurality of the first through holes 11 are then formed in the substrate. The first through holes 11 are spaced apart the same distance as the second through holes 12, but shifted in the transverse direction of the substrate. Next, a thin-film semiconductor layer 3 for photoelectric conversion is formed as shown in FIG. 2(e). In this embodiment, an n-i-p junction was formed, using a hydrogenated amorphous-silicon semiconductor layer, which was deposited by the conventional glow discharge decomposition method. The photoelectric conversion layer may also be formed of a thin-film of CdTe/CdS, CuInSe$_2$/CdS besides amorphous silicon. Further, a second electrode layer 4 made of a transparent conductive material is formed thereupon as shown in FIG. 2(f). A conductive oxide film made of ITO, SnO$_2$, or ZnO is normally used. An ITO film was made in this embodiment using a sputtering process. In depositing the above layer, so as not to form it in the vicinity of the second through hole 12, a masking is applied thereover. It also is not necessary to leave the semiconductor layer 3 in this area. However, the semiconductor layer 3 degrades in resistance in the vicinity of the second through hole 12 during this masking process and causes a short-circuit between the second electrode layer 4 and the third electrode layer 51. In this process, it is essentially important that the second electrode layer 4 extends over the semiconductor layer 3 in the inner face of the through hole 11. Finally, as shown in FIG. 2(g) an outer third electrode layer 52 of a low-resistance conductive film, i.e. a metallic film, is formed on the opposite side of the substrate. In this embodiment, Al, Ag, or Cr was used for sputtering of this layer. At this time, the outer third electrode layer 52 extends into the through hole 11, and contacts the extended portion of the second electrode layer 4 therein, which contacts the inner third electrode layer, connecting the second electrode layer 4 with the inner 51 and outer third electrode layers 52 through a resistance as low as practically possible. The outer third electrode layer 52, which extends also into the second through hole 12, contacts only the semiconductor layer 3 therein of high resistance, being substantially insulated from the second electrode layer 4. FIG. 3(a) is a fragmentary plan view showing the solar cell stock material, which is manufactured by the processes described above. FIGS. 3(b), (c), (d), and (e) are crosssectional views taken along lines B—B, C—C, D—D, and E—E of FIG. 3(a) respectively. The inner and outer third electrode layers 51, 52 are shown as a single third electrode layer 5. As viewed from the transparent electrode layer side in FIG. 3(a) the solar cell stock material is divided into an effective part 6 and an ineffective part 7 for power generation. The effective part for power generation 6 contributes to photoelectric conversion, the second electrode layer 4 being present. The ineffective part for power generation 7 does not contribute to photoelectric conversion, the semiconductor layer 3 being exposed. In FIG. 3(a) the ineffective part for power generation 7 occupies a relatively large area, but the effective part for power generation 6 can be increased by enlarging the width thereof. The structure shown in FIG. 3 has no independent (+)and (−)electrodes for outputting electricity as a solar cell. According to the embodiment of this invention, the solar cell material in this state is mass-produced.

FIGS. 4(a) to (e) show a thin-film solar cell, which is manufactured from the solar cell stock material of FIG. 3. In FIGS. 4(a) to (e), (a) is a plan view, and (b), (c), (d), and (e) are cross-sectional views corresponding to the same views as in FIGS. 3 (b) to (e). Using an energy beam such as a laser, parts of the laminated composite on the upper face of the substrate and parts of the third electrode layer on the opposite (i.e. lower)face thereof, each including pairs of the first through holes 11 and the second through holes 12, are respectively partitioned by first separating grooves 81 and second separating grooves 82, respectively. The first separating grooves 81 and the second separating grooves 82 are spaced at the same intervals, but shifted with respect to each other so that a row of the through holes 12 is disposed between the first separating grooves 81 and the second separating grooves 82. In this case, the solar cell array is so structured that the solar cell units, in which the pairs of first through holes 11 are present in the length d1 between the second separating grooves 82, are connected in series. This structure in FIG. 4 makes possible the series-connection of as many of the solar cell units as possible from the solar cell stock material in FIG. 3. According to the present invention, the number of series-connected solar cell units can be varied in a given solar cell material in order to achieve a desired output voltage of the thin-film solar cell.

The number of series-connected solar cell units in FIGS. 1(a) to (e) is half of that in FIG. 4, where the thin-film solar cell is made of the stock material shown in FIG. 3. The first separating grooves 81 and the second separating grooves are disposed so that each partitioned segment includes two rows (i.e. two pairs) of the first through holes 11 and one pair of the second through holes 12. In order for the segment of length d2 between each separating groove to function as a solar cell unit, a through hole 13 is formed by removing the peripheral portion of the through holes 12 located farthest from the separating groove 82, using a mechanical punch or an energy beam. This causes the third electrode layer 5 and the first electrode layer 2 to be disconnected. The third electrode layer 5, which is connected to the second electrode layer 4 segmented by two separating grooves 81, is connected to the first electrode layer 2 via the second through holes 12 positioned across the first separating groove 81. As a result, a solar cell unit of length d2, that is two times the length d1, is connected in series. The number of series-connected solar cell units thus is half of that in FIG. 4. In this thin-film solar cell, it is clear that the number of series-connection of the solar cell units can be made 1/n (n=an integer) with ease.

In another embodiment shown in FIGS. 5(a) to (e), the peripheral portion of the through hole 12 is cut out by a cutter, for example, scissors. If a larger area than the second through hole is removed in the ineffective part for power generation 7, the fabrication method and the shape of the removed portion may be selected at will.

Figure 6:
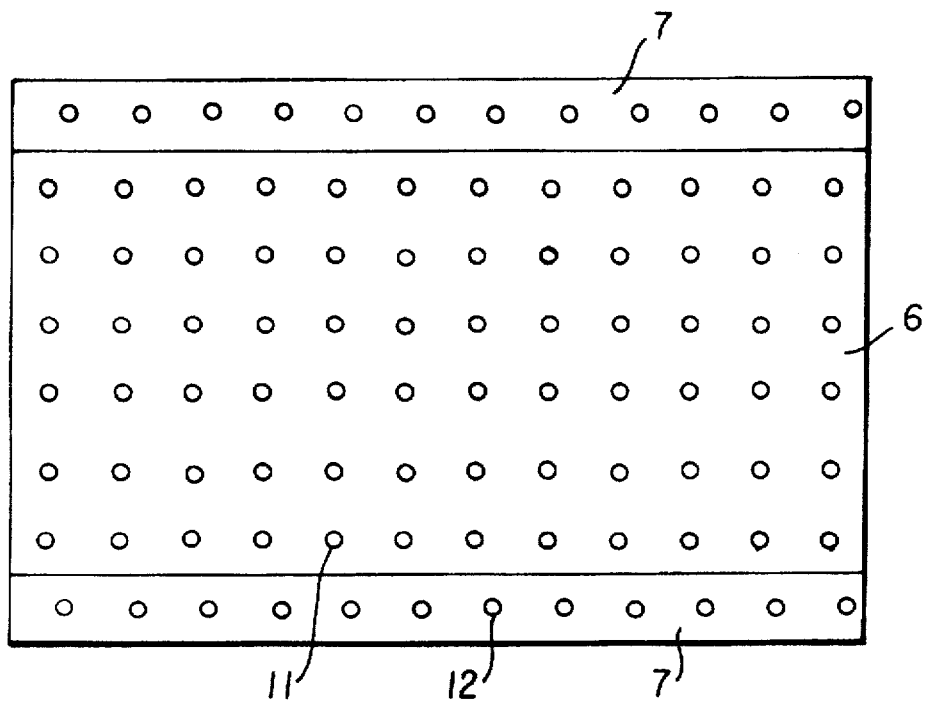
FIG. 6 shows an example of a solar cell stock material, which is manufactured by the present invention, in plan view.
Figure 7:
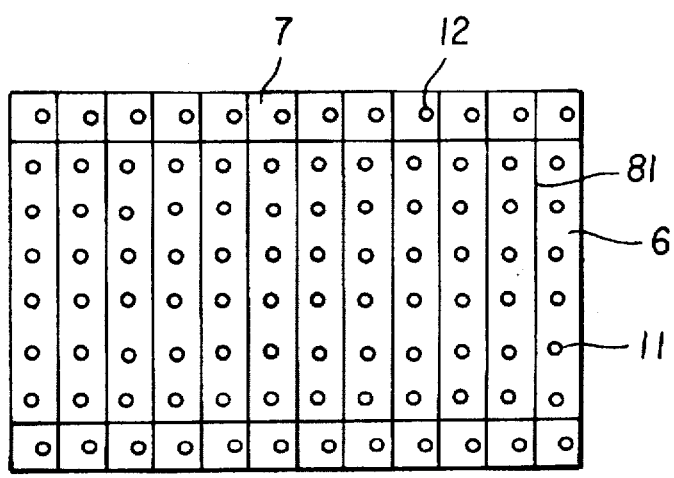
FIG. 7 shows an example of a thin-film solar cell array, which is manufactured of the solar cell stock material of FIG. 6, in plan view.
Figure 8:
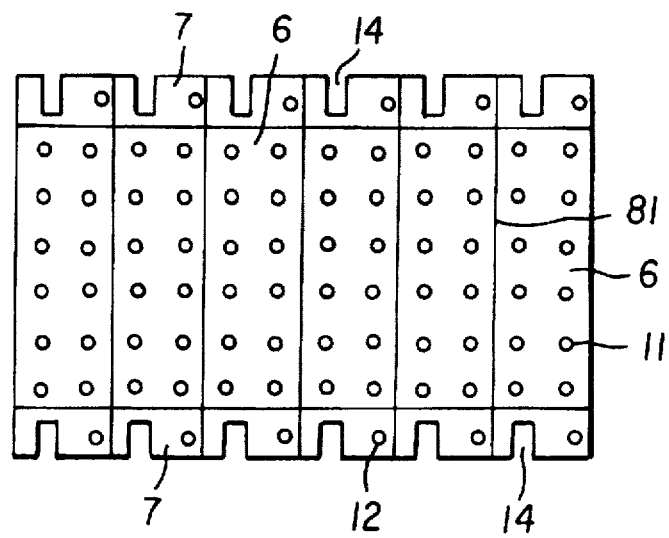
FIG. 8 shows another example of a thin-film solar cell array, which is manufactured of the solar cell stock material of FIG. 6, in plan view.
Figure 9:
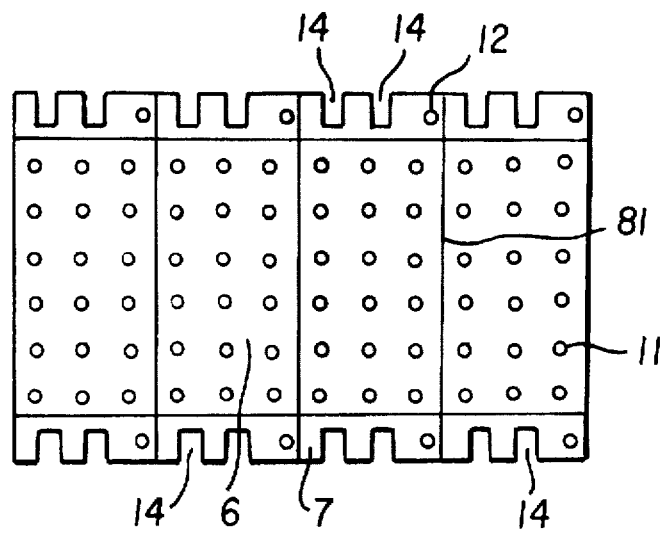
FIG. 9 shows still another example of a thin-film solar cell array, which is manufactured of the solar cell stock material of FIG. 6, in plan view.

FIG. 6 shows an overall plan view of an example of a solar cell stock material, which is seen from the light-incident side. Based on the solar cell stock material described above, FIGS. 7, 8 and 9 show examples of series-connection structures for connecting the solar cell units. The number of units which are series-connected is determined by the number of the rows of through holes for connection as shown in FIG. 7. If the number of rows of the first through holes 11 and the second through holes 12 is 2n, then the number of series-connected units is n, as shown in FIG. 8. If the number of rows of the first through holes 11 and the second through holes 12 is 3n, then the number of series-connection is n, as shown in FIG. 9. By determining adequately the first separating grooves 81, the second separating grooves 82, and the removed portions 14 of the second through holes, based on the overall number of the second through holes 12 of the solar cell, the number of series connected solar cell units can be chosen at will. If the number of the first through holes 11 and the second through holes 12 is made large enough by design, the number of series connected units can be varied more freely. Producing the stock solar cell material with numerous through holes with adequate strength will make it easy to supply solar cell arrays with output voltages as required.

Figure 3D:
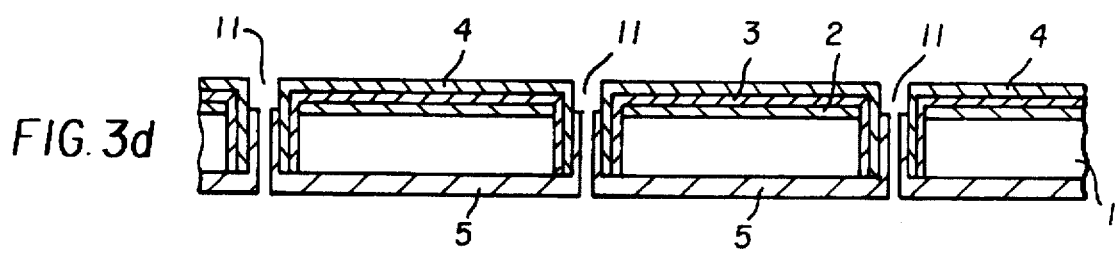
Figure 3E:
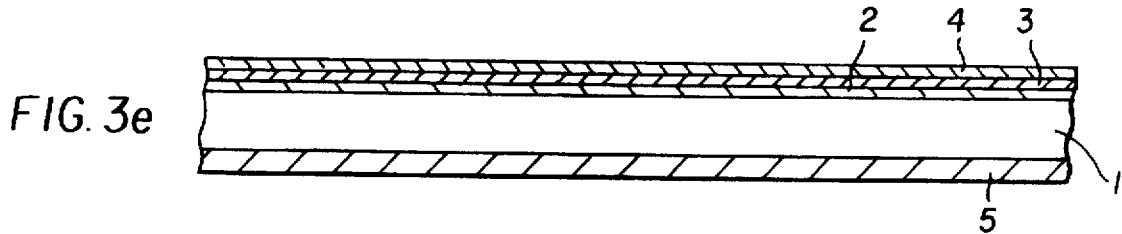
Figure 4A:
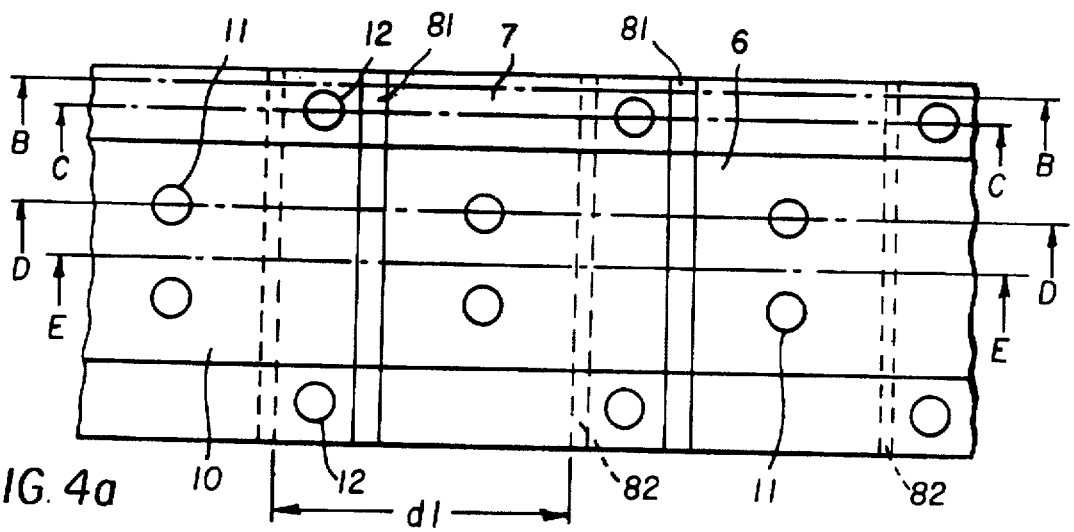
FIGS. 4(a) to (e) are fragmentary drawings showing the thin-film solar cell array, which is manufactured of the solar cell stock material of FIG. 3, according to one embodiment of the present invention.
Figure 4B:
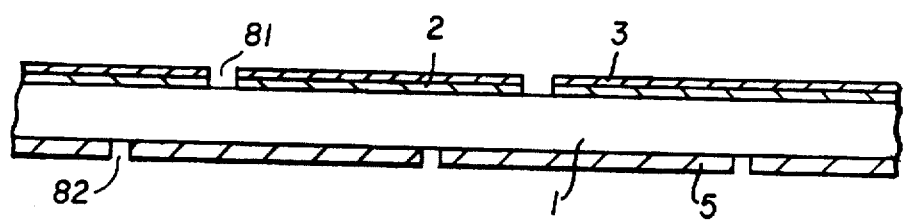
Figure 4C:
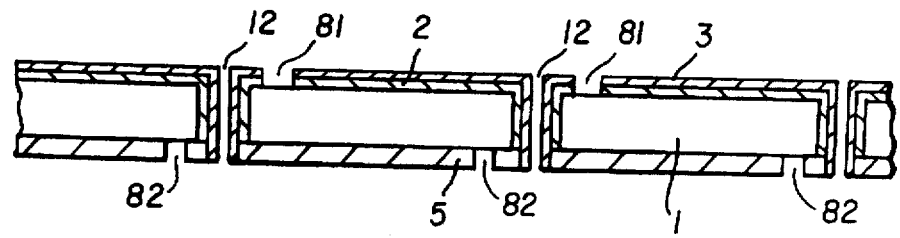
Figure 4D:
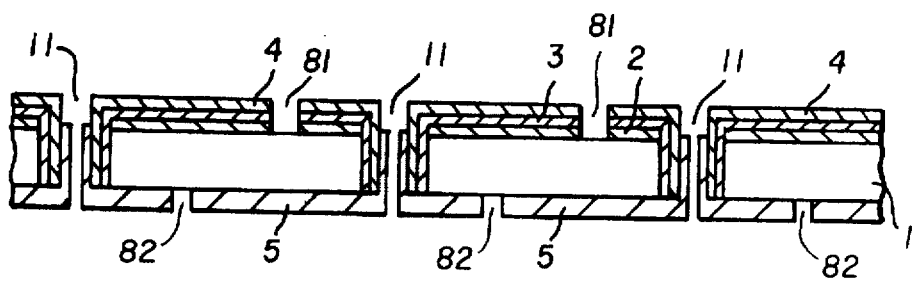
Figure 4E:
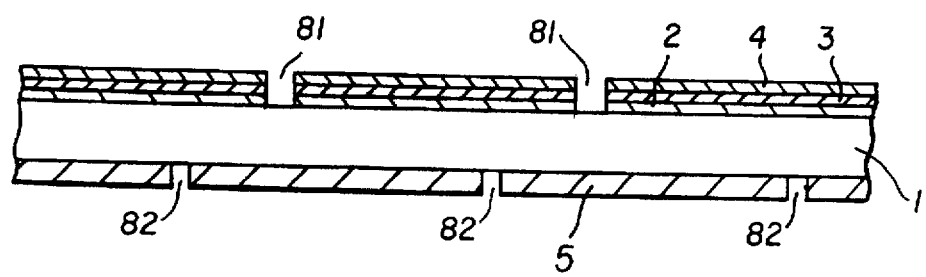
Figure 5A:
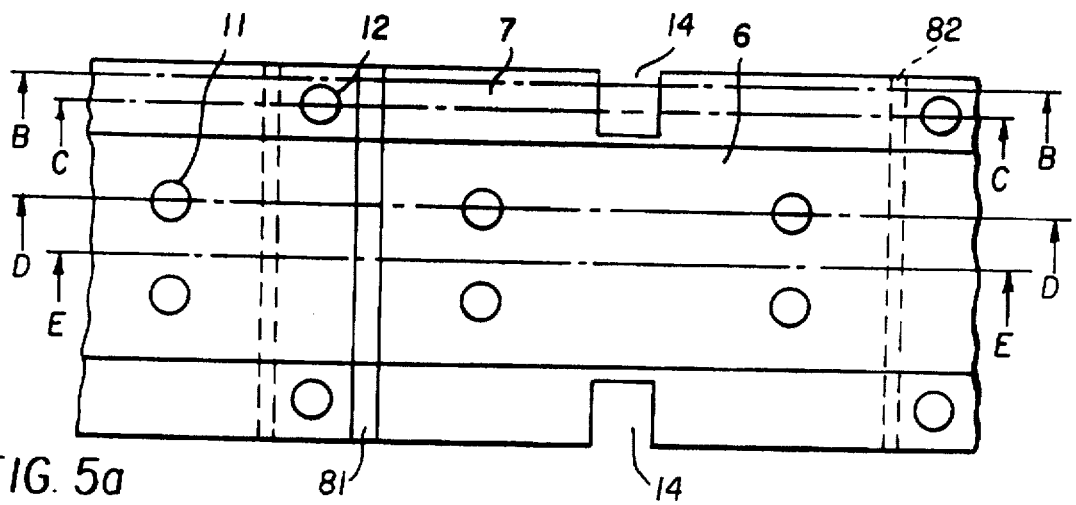
FIGS. 5(a) to (e) are fragmentary drawings showing a thin-film solar cell array, which is manufactured of the solar cell stock material of FIG. 3, according to another embodiment of the present invention.
Figure 5B:
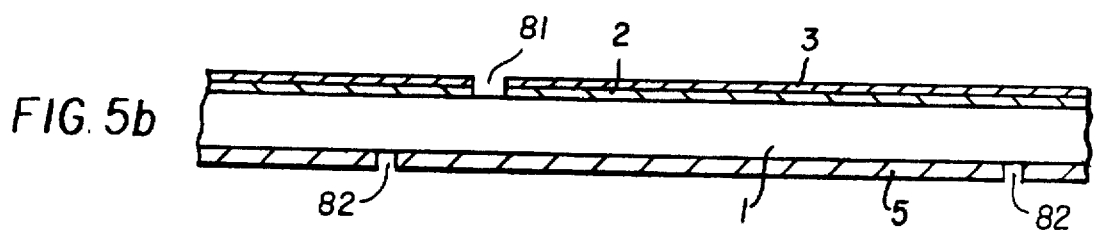
Figure 5C:
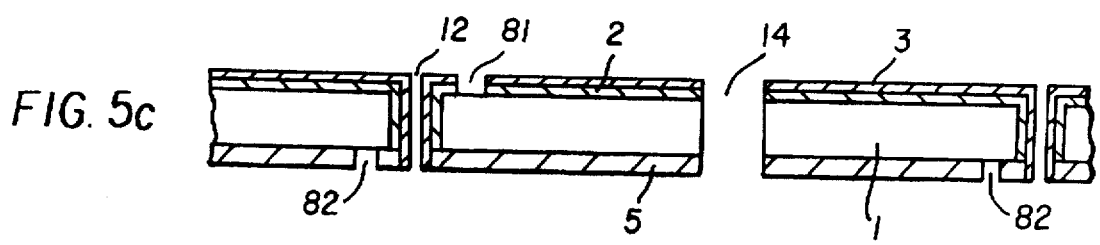
Figure 5D:
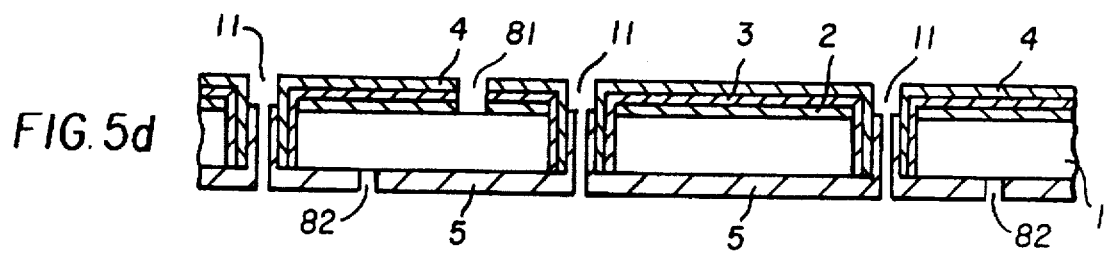
Figure 5E:
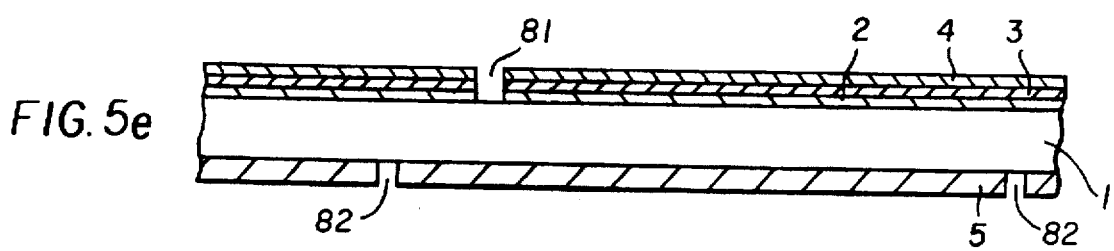
Figure 10A:
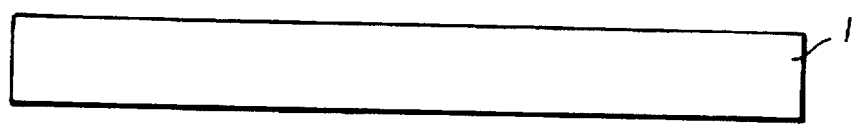
FIGS. 10(a) to (f) are cross-sectional drawings showing the manufacturing processes of a thin-film solar cell stock material and array, according to one embodiment of the present invention, in order from (a) to (f)
Figure 10B:
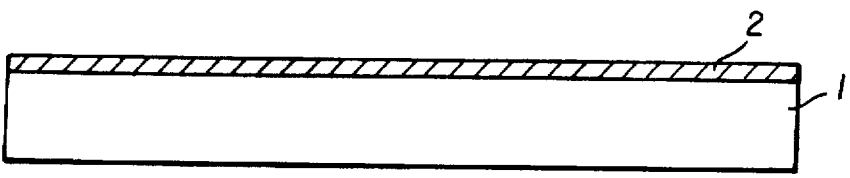
Figure 10C:
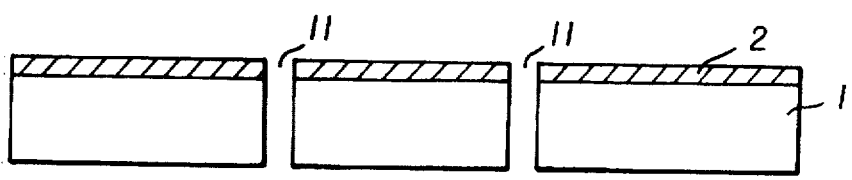
Figure 10D:
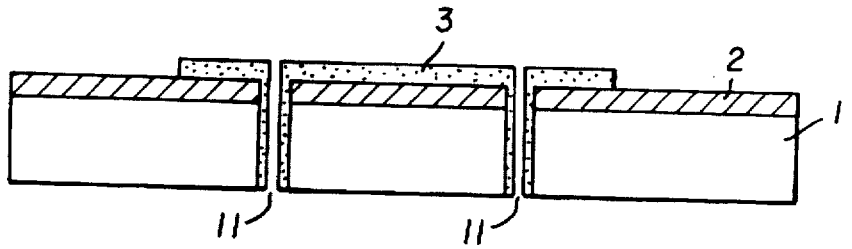
Figure 10E:
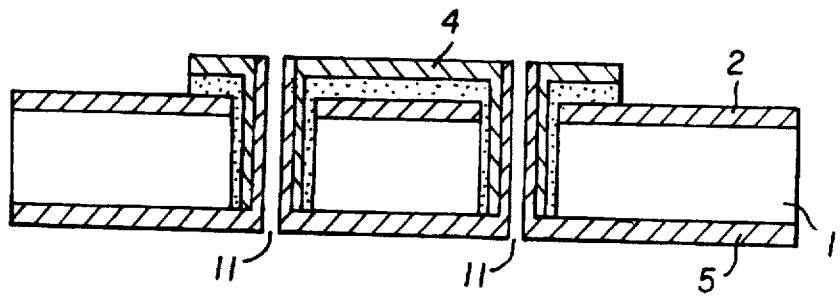

FIGS. 10(a) to (f) are cross-sectional drawings showing the manufacturing processes of a thin-film solar cell, according to another embodiment of the present invention. Without forming the second through holes 12 as in FIG. 3 through the insulating substrate 1 of FIG. 10(a) an Ag electrode of 0.2 microns thickness was disposed thereon as the first electrode layer 2 by a sputtering process, as shown in FIG. 10(b). Then, as shown in FIG. 10(c) a plurality of rows (two rows in this case) of the first through holes 11 are formed through the substrate 1 at equally spaced intervals. The size and interval of the first through holes 11 is designed not to lower the output of the solar cell. In this embodiment, the design value of the through hole 11 was 1 mm in diameter and 1 cm in interval in consideration of the sheet resistance of the second electrode layer and the contact resistance between the second electrode layer and the third electrode layer. The shape of the first through hole 11 is not restricted to a circle but may preferably define, for example, an ellipse or a rectangle to its better effect, which the smaller area and the longer circumference thereof will produce. Next, the thin-film semiconductor layer 3 for photoelectric conversion is formed as illustrated in FIG. 3(d). In this embodiment, an n-i-p junction was formed as shown in FIG. 10(d) using a semiconductor material of the hydrogenated amorphous-silicon family. Besides this material, CdTe/CdS, CuInSe$_2$/CdS, etc. are also applicable to the thin-film solar-cell. During this process, areas not covered by the hydrogenated amorphous silicon layer are defined by masking. Then a transparent second electrode layer 4 was laminated thereover using an ITO film. Finally, the third electrode layer 5 of low-resistance conductive film was disposed on the face of the substrate opposite the laminated composite of the solar cell. In this embodiment, the low-resistance conductive film was formed by an Ag sputtering process. Besides this material, corrosion resistant Cr or Ti are also applicable as described above.

Figure 11A:
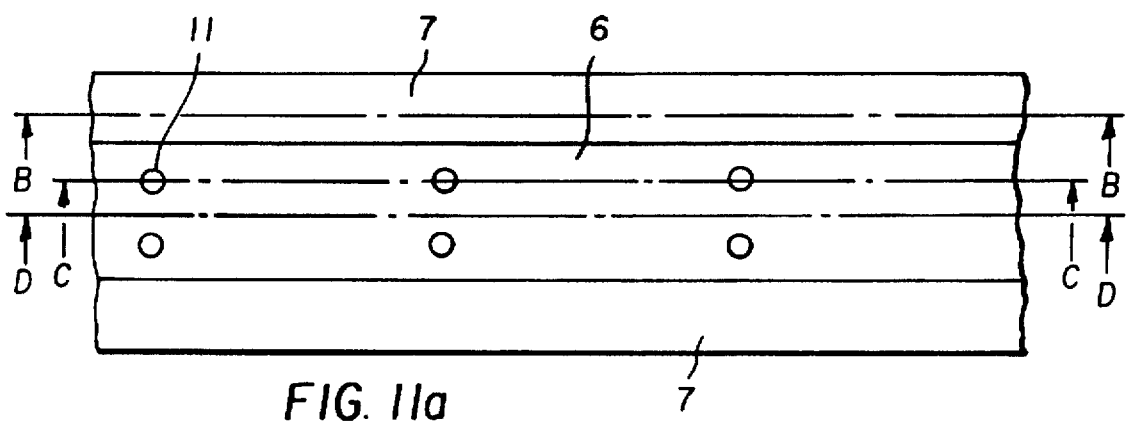
FIGS. 11(a) to (d) are fragmentary drawings showing the solar cell stock material, which is manufactured by the processes up to (e) of FIG. 10.
Figure 11B:
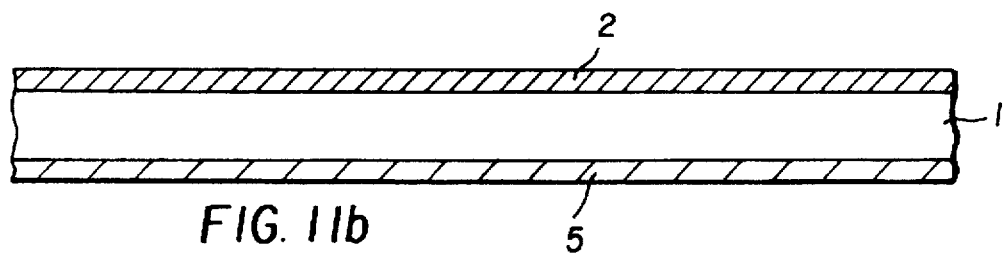
Figure 11C:
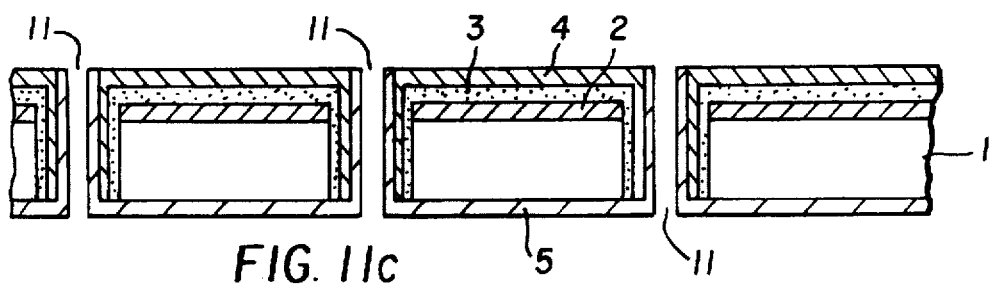
Figure 11D:
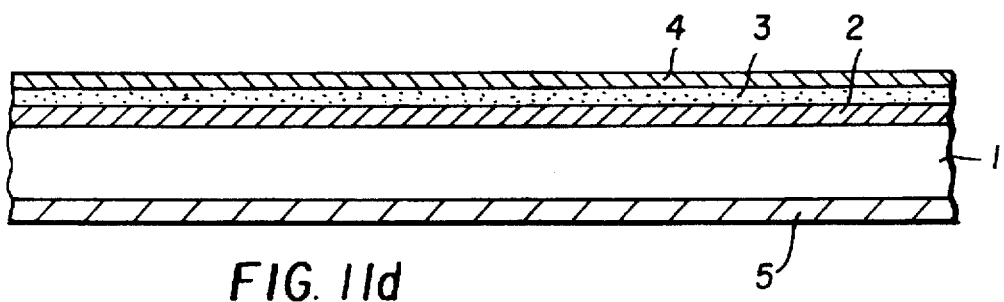
Figure 12A:
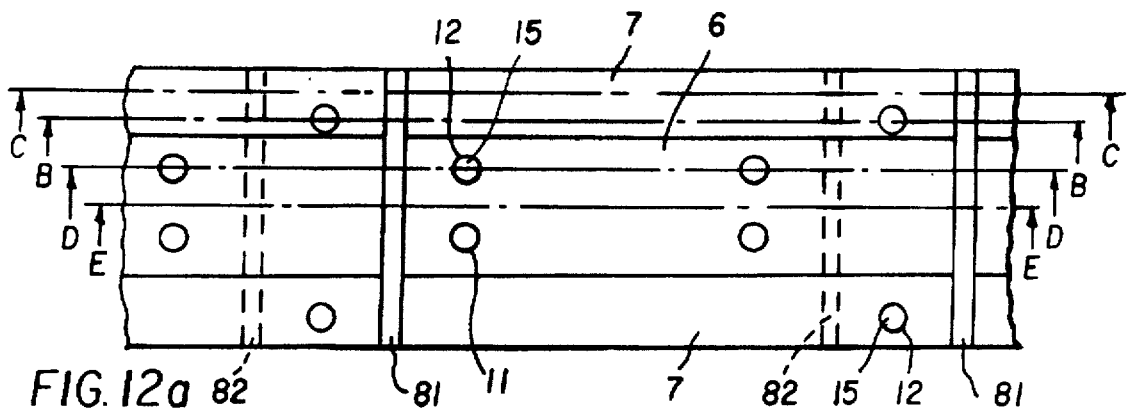
FIGS. 12(a) to (e) are fragmentary drawings showing a thin-film solar cell array, which is manufactured by the processes up to (f) of FIG. 10.
Figure 12B:
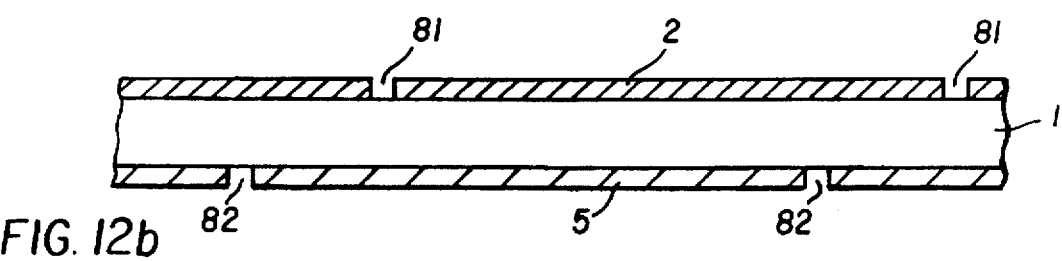
Figure 12C:
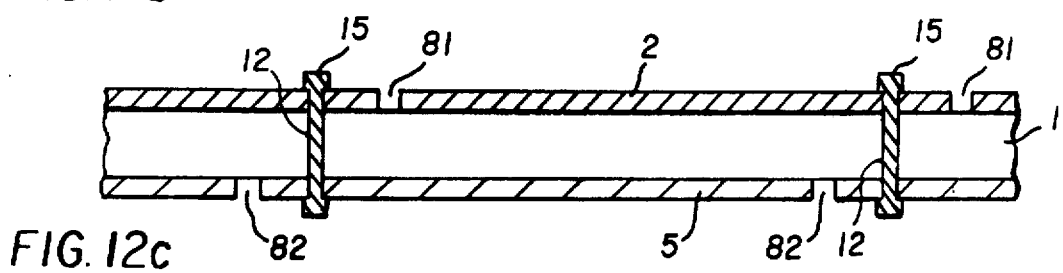
Figure 12D:
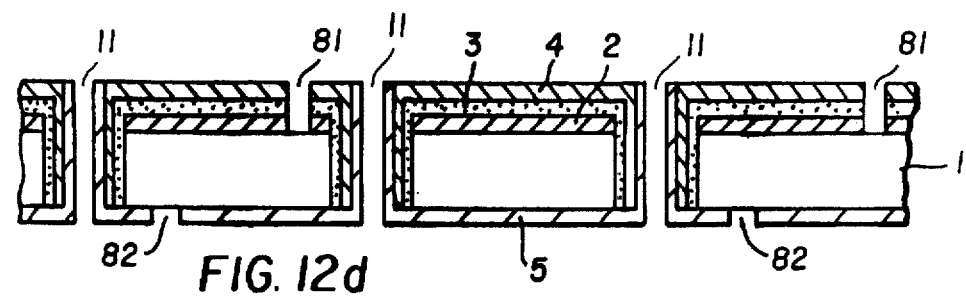
Figure 12E:
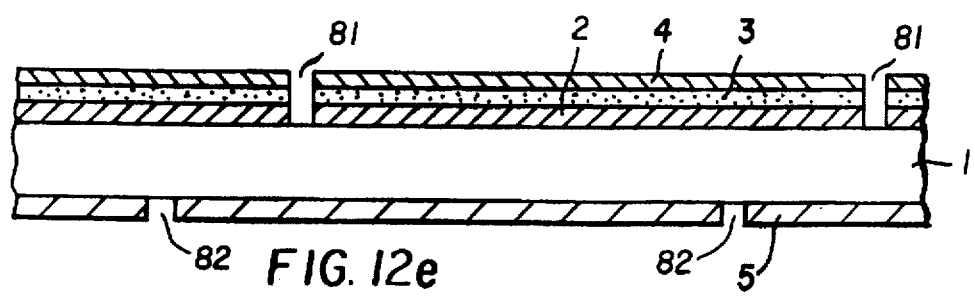
Figure 13A:
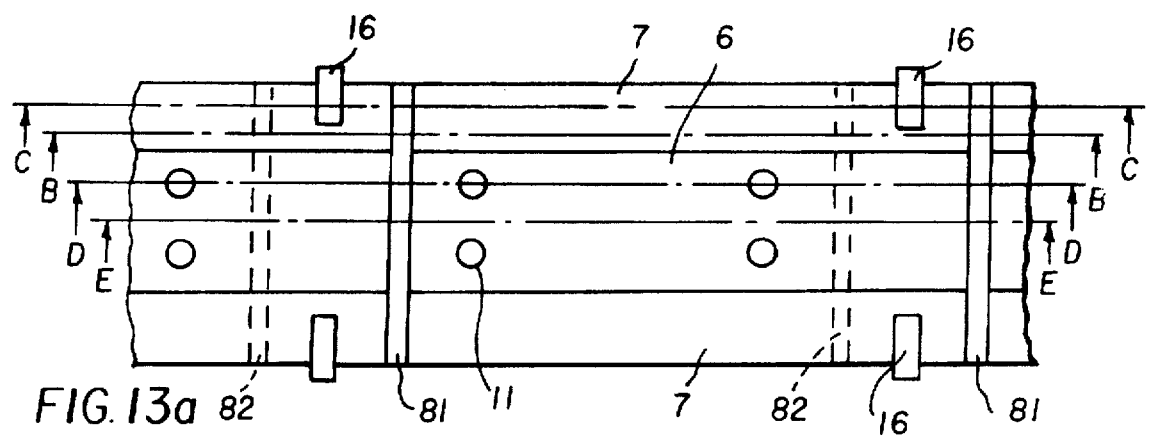
FIGS. 13(a) to (e) are fragmentary drawings showing a thin-film solar cell, which is manufactured of the solar cell stock material of FIG. 11.
Figure 13B:
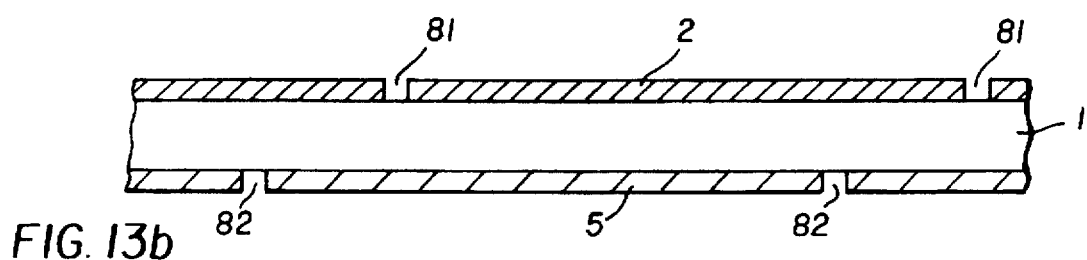
Figure 13C:
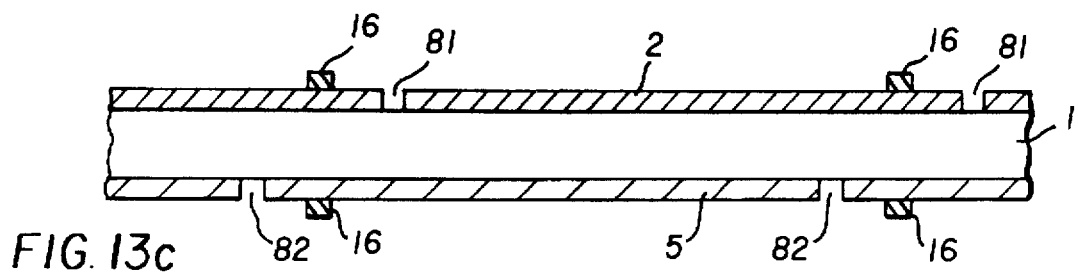
Figure 13D:
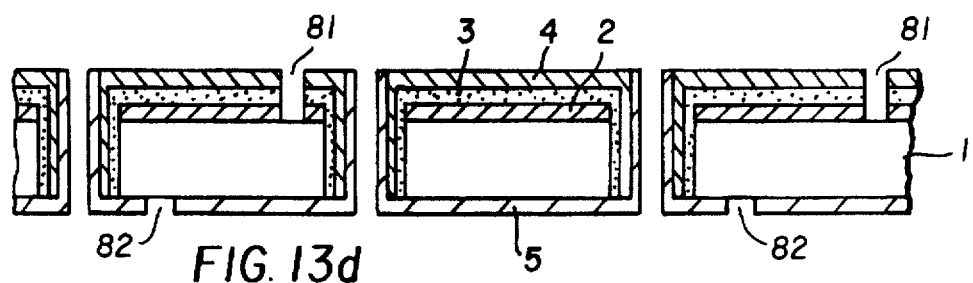
Figure 13E:
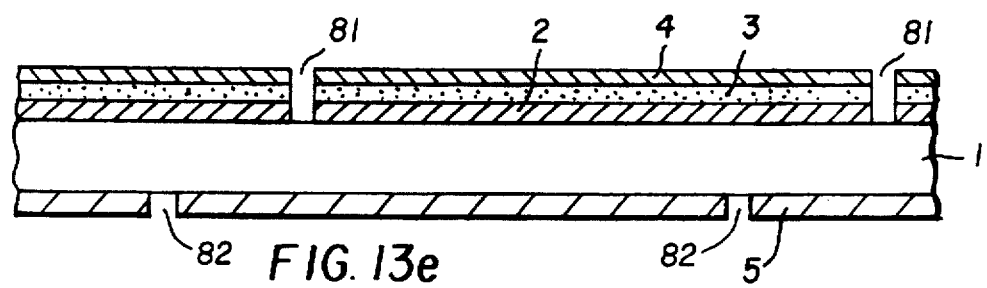

FIG. 11(a) is a plan view showing the solar cell material, which is manufactured by the processes described above, as viewed from the transparent electrode side thereof. FIGS. 11(b), (c), and (d) are cross-sectional views taken along lines B—B, C—C, and D—D of FIG. 11(a), respectively. A large quantity of the solar cell stock material is first produced in this state.

Figure 10F:
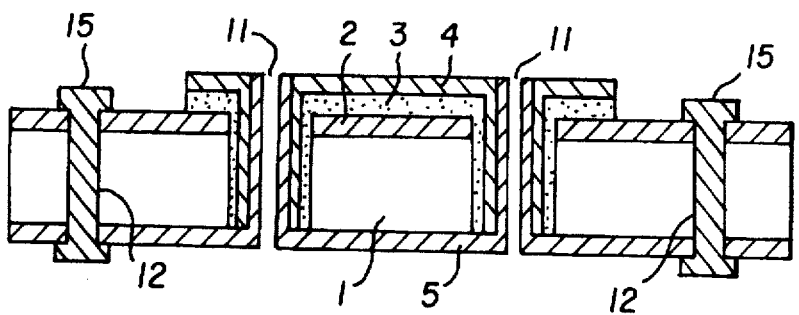

In order to obtain the desired output voltage needed, the laminated composite comprising the first electrode layer 2, the thin-film semiconductor layer 3 and the second electrode layer 4 were segmented by first separating grooves 81 using a laser process or a supersonic mechanical removal process, and the third electrode layer was also segmented by second separating grooves 82 using a laser process. Next, the second through holes 12 were punched in the areas where the first electrode layer 2 is exposed. Using a conductive material such as a conductive paste 15, the exposed first electrode layer 2 was electrically connected via the second through holes 12 to the third electrode layer 5, which is connected to the second electrode layer 4 of the adjoining solar cell unit, as shown in FIG. 10(f). A soldering process is also applicable to connecting the first electrode layer 2 with the third electrode layer 5 of the adjoining solar cell unit. FIGS. 12(a) to (e) show a thin-film solar cell array, which is manufactured by the processes described above. In FIGS. 12(a) to (e), (a) is a plan view, and (b), (c), (d), and (e) are cross-sectional views.

Besides the above-mentioned conductor 15 which fills the through hole 12 of the substrate 1, connecting the first electrode layer 2 of a solar cell unit with the third electrode layer 5 of another adjoining one can also be achieved by a conductor passing over the side of the substrate 1. FIGS. 13(a) to (e) show the thin-film solar cell array, which is manufactured by the processes described above. In FIGS. 13(a) to (e), (a) is a plan view, and (b), (c), (d), and (e) are cross-sectional views. In this embodiment, connection of the first electrode layer 2 of the solar cell unit with the third electrode layer 5 of the other adjoining unit was made by a conductive tape 16 passing over the side of the substrate 1. Instead of the conductive tape, a metallic strip is also useful.

With these manufacturing processes, series connected type solar cell arrays can be structured as a plurality of submodules with output voltage, which is varied as required, as a roll of the solar cell material.

Advantages of the Invention

According to the present invention, by forming and arranging a first through hole, via which a transparent electrode layer of a laminated composite of a solar cell disposed on a face of an insulating substrate is connected to a third electrode layer disposed on the opposite face thereof, and a second through hole, via which a first electrode layer of the laminated composite is connected to the third electrode layer, equidistantly apart from each other; selecting out of the second through holes only those determined by the number thereof divided by an integer or selecting out of the first through holes those, via which the first electrode layer is to be connected to the third electrode layer, in the number thereof divided by an integer; segmenting the solar cell laminate into solar cell units in correspondence to the position selected for connecting the first electrode layer and the third electrode layer; making it possible to connect the solar cell units in series with the number of series-connected unit cells adaptable for a desired output voltage in a given length of a solar cell material, production efficiency of thin film solar cell arrays with a desired output voltage has been improved.

What is claimed is:

1. A thin-film solar cell array comprising:

a first electrode layer disposed on a first face of an insulating elongated strip substrate; a transparent second electrode layer disposed above the first electrode layer so as to sandwich a semiconductor photoelectric conversion layer therebetween, wherein the first, second, and photoelectric conversion layers comprise a laminated composite; a third electrode layer disposed on a second, opposite face of the substrate; and a plurality of first through holes and a plurality of second through holes each equidistantly spaced in the longitudinal direction of the substrate, such that an interval of the first through holes multiplied by an integer equals an interval of the second through holes;

wherein the second electrode layer is electrically connected to the third electrode layer by conductors; the second electrode layer is substantially insulated from the first electrode layer; the first electrode layer is electrically connected to the third electrode layer by other conductors; the laminated composite is segmented on said first face of the substrate by a plurality of first separating grooves which are positioned in the transverse direction of the substrate between a second through hole and an adjacent first through hole; and the third electrode layer is segmented on the second opposed face of the substrate by a plurality of second separating grooves which are positioned in the transverse direction of the substrate diagonally opposite said first separating grooves across said second through hole.

2. The cell of claim 1, wherein the conductors connecting the second electrode layer with the third electrode layer extend into the first through holes, the other conductors connecting the first electrode layer with the third electrode layer extend into the second through holes.

3. The cell of claim 2, wherein the first through holes into which the conductors connecting the second electrode layer with the third electrode layer extend pass through the lamination composite, the substrate, and the third electrode layer.

4. The cell of claim 1, wherein the second through hole passes at least through a region of the first electrode layer over which the second electrode layer is not formed, the substrate and the third electrode layer.

5. The cell of claim 1, wherein the other conductors connecting the first electrode layer with the third electrode layer pass over a side face of the substrate.

6. A method for manufacturing a thin-film solar cell array, comprising the steps of:

forming a first electrode layer on a first face of an insulating elongated strip substrate, laminating a semiconductor layer for photoelectric conversion thereover, and further laminating a transparent second electrode layer over said photoelectric conversion layer opposite the first electrode layer, wherein the, first electrode, semiconductor, and second electrode layers comprise a laminated composite;

forming a third electrode layer on a second, opposite face of the substrate;

forming and a plurality of first through holes at equal intervals in the longitudinal direction of the substrate, and then providing conductors therethrough which are substantially insulated from the first electrode layer and which connect the second electrode layer with the third electrode layer;

forming and a plurality of second through holes at intervals equal to those of the first through holes but not intersected thereby in the transverse direction of the substrate, and then providing conductors therethrough which are substantially insulated from the second electrode layer and which connect the first electrode layer with the third electrode layer;

selecting a plurality of third through holes from the plurality of second through holes aligned in the longitudinal direction of the substrate, said plurality of third through holes corresponding to the number of said second through holes divided by an integer, arranging the plurality of third through holes at equal intervals and removing the conductor of said plurality of third through holes;

forming in the transverse direction of the substrate a first separating groove, which segments at least the laminated composite and is positioned between a second through hole and an adjacent first through hole; and forming in the transverse direction of the substrate a second separating groove, which segments the third electrode layer and is positioned diagonally opposite the first separating groove across said second through hole.

7. The method of claim 6, wherein, so as to remove the conductors from the inner sides of the plurality of third holes, larger through holes including the third through holes are formed through the first electrode layer, the substrate, and the third electrode layer.

8. The method of claim 6, wherein, so as to remove the conductors from the inner sides of the plurality of third through holes, the peripheral portions of the third through holes involving the substrate, the first electrode layer, and the third electrode layer are removed.

9. A method for manufacturing a thin-film solar cell array, comprising the steps of:

forming a first electrode layer on a first face of an insulating elongated strip substrate, laminating a semiconductor layer for photoelectric conversion thereover, and further laminating a transparent second electrode layer on said photoelectric conversion layer opposite the first electrode layer, wherein the first electrode, semiconductor, and second electrode layers comprise a laminated composite;

forming a third electrode layer on a second, opposite face of the substrate;

forming a plurality of first through holes at equal intervals in the longitudinal direction of the substrate, and then providing conductors therethrough which are substantially insulated from the first electrode layer and which connect the second electrode layer with the third electrode layer;

forming a plurality of second through holes at intervals equal to those of the first through holes but not intersected thereby in the transverse direction of the substrate, and then providing conductors therethrough which are substantially insulated from the second electrode layer and which connect the first electrode layer with the third electrode layer;

selecting a plurality of third through holes from the plurality of second through holes, the number of said third through holes corresponding to a number of said second through holes divided by an integer, arranging the third through holes at equal intervals and removing said conductor of the third through holes;

forming in the transverse direction of the substrate a plurality of first separating grooves, which divide at least the laminated composite into segments with include a plurality of the first through holes aligned in the longitudinal direction of the substrate, the first separating grooves being formed at equally spaced intervals;

providing conductors at the opposite ends of the first through holes adjoining the first separating grooves, said conductor connecting the second electrode layer with the third electrode layer; and forming in the transverse direction of the substrate a plurality of second separating grooves, which divide the third electrode layer and are positioned diagonally opposite the first separating grooves across said conductor.

10. The method of claim 9, wherein, after forming a through hole which extends through the first electrode layer, the substrate and the third electrode layer, a conductive material is used to fill said through hole and connect the first electrode layer with the third electrode layer.

* * * * *